United States Patent [19]

Suarez-Gartner

[11] 3,906,488

[45] Sept. 16, 1975

[54] REVERSIBLE ANALOG/DIGITAL (DIGITAL/ANALOG) CONVERTER

[75] Inventor: Ricardo E. Suarez-Gartner, Berkeley, Calif.

[73] Assignee: The Regents of the University of California, Berkeley, Calif.

[22] Filed: Feb. 14, 1974

[21] Appl. No.: 442,581

[52] U.S. Cl. .................... 340/347 C; 340/347 AD; 340/347 DA

[51] Int. Cl.² .................... H03K 13/02

[58] Field of Search .. 340/347 C, 347 AD, 347 DA; 324/99 D

[56] References Cited

UNITED STATES PATENTS

| | | | |
|---|---|---|---|
| 2,729,812 | 1/1956 | Jahn | 340/347 DA |
| 3,098,224 | 7/1963 | Hoffman | 340/347 C |
| 3,251,052 | 5/1966 | Hoffman et al. | 340/347 AD |
| 3,585,634 | 6/1971 | Sharples | 340/347 AD |
| 3,626,408 | 12/1971 | Carbrey | 340/347 AD |
| 3,651,518 | 3/1972 | Carbrey | 340/347 AD |
| 3,750,143 | 7/1973 | Osborne | 340/347 AD |

*Primary Examiner*—Charles D. Miller
*Attorney, Agent, or Firm*—Flehr, Hohbach, Test, Albritton & Herbert

[57] ABSTRACT

A converter for providing an analog output signal corresponding to a digital input signal, or for providing a digital output signal corresponding to an analog input signal. The converter includes a serial digital to analog switching circuit and a voltage comparator. The comparator output is connected to a digital number storage means which is connected to control means for controlling the digital to analog switching circuit. A digital number stored in the digital storage means is transfered to the control means. The digital to analog switching circuit contains a pair of matched capacitors having one plate connected to ground potential. A first switching means is actuated by the control means to discharge the first capacitor if the least significant bit in the digital number is a zero and to charge the first capacitor to a reference voltage if the least significant bit in the digital number is one. The control means actuates a second switch to discharge the second capacitor. The charge on the first capacitor is shared with the second capacitor through a charge sharing switch thereby providing a voltage on both capacitors corresponding to the digital bit. The sequence of operating the first switching means and charge sharing switching means is repeated to produce a voltage on both capacitors corresponding to the digital number. The voltage on either capacitor may be connected to one input of the voltage comparator and an unknown analog voltage may be connected to another input of the voltage comparator. In the instance where the second capacitor is connected to the comparator an output is produced therefrom having a predetermined voltage level for the condition when the unknown analog voltage exceeds the voltage on the second capacitor and having zero output when the unknown analog voltage is less than the voltage on the second capacitor. The output of the voltage comparator is connected to the storage means for the digital number, so that the digital number is stored sequentially from the most significant bit to the least significant bit. The control means provides for shifting and latching the digital number in the storage means.

22 Claims, 14 Drawing Figures

REVERSIBLE ANALOG/DIGITAL (DIGITAL/ANALOG) CONVERTER

BACKGROUND OF THE INVENTION

1. Field of the Invention

This invention relates to a circuit for converting data between digital and analog forms and more particularly to such a circuit that utilizes as few as two matched capacitors in performing the conversion.

2. Description of the Prior Part

Previously disclosed analog to digital converter concepts required multiple ungrounded precision elements and many concepts also required high gain linear analog amplifiers, unity gain amplifiers, integrators or other operational amplifier circuits. Matching of the large number of precision elements becomes difficult, even when utilizing integrated circuit techniques. The acquisition of closely matched characteristics between the elements invites high cost, and the means for manufacturing the necessary components for the converter also dictate high costs. The matched characteristics of the elements in the converter determine the attainable accuracy, and the techniques for forming the circuitry determine the availability of acceptable devices or circuits.

There is therefore, a need for apparatus for converting data between digital and analog forms which utilizes a minimum number of matched precision elements, and which utilizes the most practical fabrication techniques for providing the elements from both the size and cost standpoints.

SUMMARY AND OBJECTS OF THE INVENTION

The present invention is directed toward circuit means for converting data between digital and analog forms. A digital store is used for receiving a digital number. A switch controlled capacitor charge circuit includes ground and voltage reference terminals and first and second capacitors. The capacitors have one plate connected to the ground terminal and the other plate connected to opposite sides of a charge sharing switch. First switching means are provided for connecting the ungrounded plate of the first capacitor to either discharge the first capacitor to the ground terminal or connect the first capacitor to the voltage reference terminal. Second switching means are provided for discharging the second capacitor to the ground terminal. Control means provides sequential operation for timed intervals of the charge sharing switch and the first and the second switching means for each digital number bit. The switching sequence includes actuation of the second switch means, actuation of the first switch means to select said ground reference terminal for a least remaining significant bit zero, and to select said voltage reference terminal for a least remaining significant bit one, and actuation of said charge sharing switch to provide an analog voltage corresponding to the digital number after the number of sequences corresponding to the number of bits in the digital number. A comparator is provided to receive the analog voltage at one input and to receive an unknown analog voltage at another input. The comparator in one embodiment provides output at a predetermined voltage level for the condition when the unknown analog voltage exceeds the analog voltage and for providing a zero at the comparator output when the analog voltage exceeds the unknown analog voltage. The comparator output is connected to the input of the digital storage means.

In general it is an object of the present invention to provide apparatus for converting the data between digital and analog forms using a minimum number of matched capacitive elements.

Another object of the present of the invention is to provide apparatus for converting data between digital and analog forms using only two matched grounded capacitors and a voltage comparator with associated circuitry so that integrated circuit fabrication may be used.

Another object of the present invention is to provide apparatus for converting data betweeen digital and analog forms providing greater accuracy than heretofor available in monolithic integrated circuit form.

Another object of the present invention is to provide apparatus for converting data between digital and analog forms which is reversible.

Another object of the present invention is to provide apparatus for converting data between digital and analog forms which may be constructed utilizing metal-insulator-semiconductor fabrication techniques.

Another object of the present invention is to provide apparatus for converting data between digital and analog forms utilizing circuit techniques for fabricating switches, matched grounded capacitors, a voltage comparator and digital circuitry utilizing integrated circuit fabrication techniques.

Additional objects and features of the invention will appear from the following description in which the preferred embodiments have been set forth in detail in conjunction with the accompanying drawings.

DESCRIPTION OF THE PREFERRED EMBODIMENTS

The reversible analog to digital converter described herein is an integrable charge redistribution analog to digital converter based on the principle of charge sharing between closely matched capacitors. The minimum number of capacitive components required and the fact that the capacitive components have one plate common makes this implementation compatible with standard metal-insulator-semiconductor integrated circuit fabrication techniques. The capability for a matching capacitor values and the capacitor temperature stability afforded in monolithic integrated circuit fabrication provides a highly accurate converter. Switching and comparator means are also realizable using metal-insulator-semiconductor integrated circuit fabrication techniques.

Figure 1:
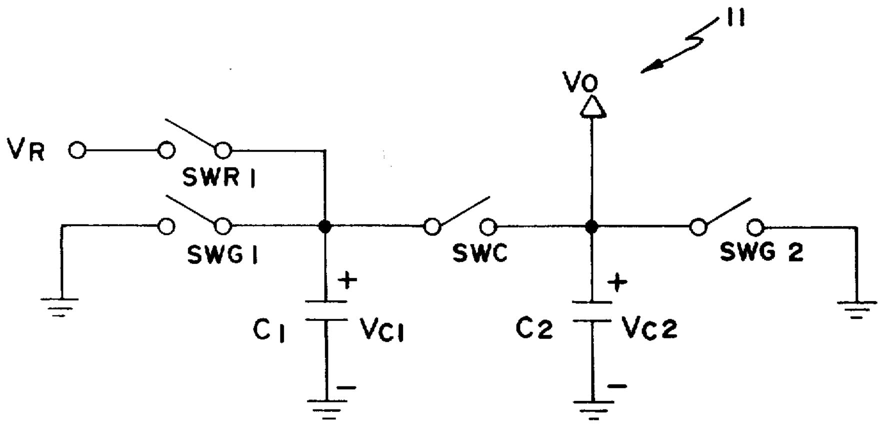
FIG. 1 is a schematic of a serial digital to analog converter.

Referring to FIG. 1 the basic circuit for the serial digital to analog converter is shown. It is well known that the initial charge Q(0) on two capacitors $C_1$ and $C_2$ with initial voltages $V_1(0)$ and $V_2(0)$ respectively is given by the following relation:

$$Q(0) = C_1V_1(0) + C_2V_2(0)$$

If the two capacitors are connected in parallel so that $V_1(f) = V_2(f)$ the initial charge on the capacitors $C_1$ and $C_2$ is redistributed according to the ratio of the capacitances and the resulting voltages are:

$$V_1(f) = V_2(f) = \frac{C_1V_1(0) + C_2V_2(0)}{C_1 + C_2}$$

If $C_1 = C_2$, then $$V_1(f) = V_2(f) = \frac{V_1(0) + V_2(0)}{2}$$

Referring to FIG. 1 first and second capacitors $C_1$ and $C_2$ respectively are seen having one plate connected to a common ground potential. A voltage reference terminal $V_R$ is shown. A voltage output connected to the ungrounded plate of capacitor $C_2$ is shown as $V_0$ in the embodiment of FIG. 1. A switch SWR1 is shown between the reference voltage terminal and the ungrounded plate of capacitor $C_1$. A switch SWG1 is also shown between the ungrounded plate of capacitor $C_1$ and a ground reference terminal. A switch SWG2 is shown between the ungrounded plate of capacitor C2 and ground reference. A switch SWC is shown between the ungrounded plates of capacitors C1 and C2.

Figure 2:
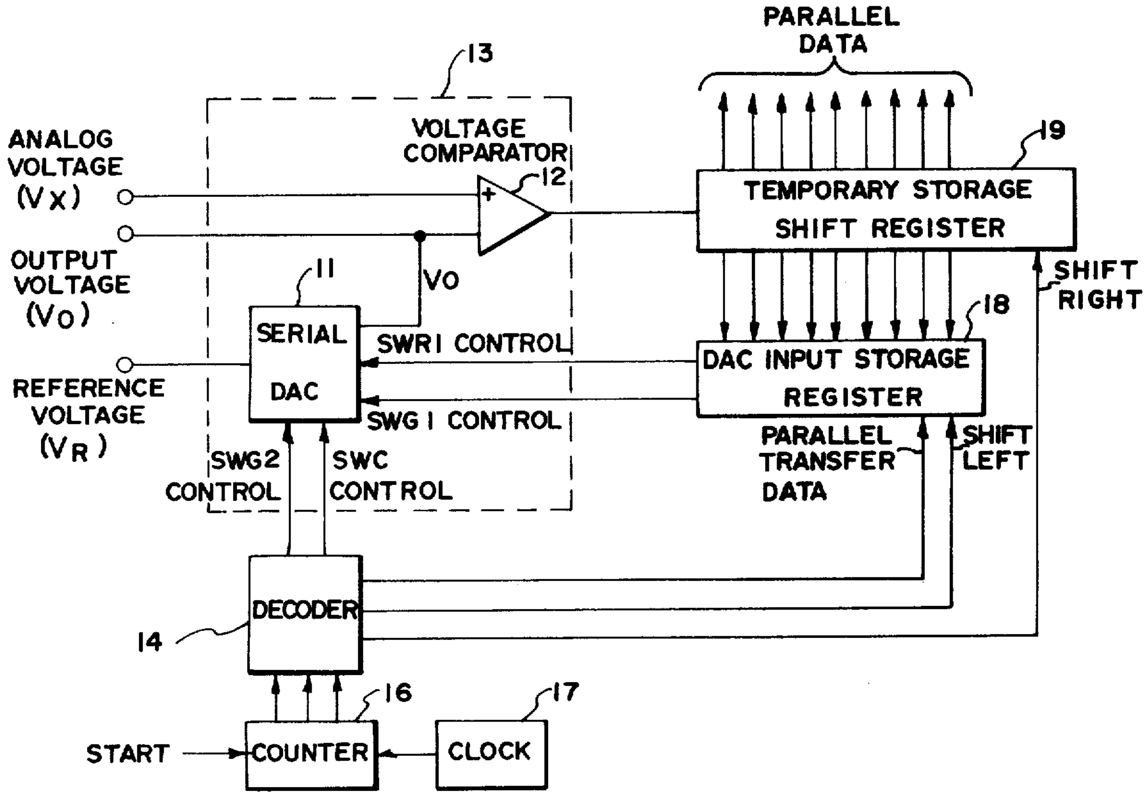
FIG. 2 is a block diagram of a reversible analog to digital converter.

Referring to FIG. 2 the serial digital to analog converter 11 of FIG. 1 is shown. A voltage comparator 12 is shown receiving the output voltage $V_0$ from the serial digital to analog converter (DAC) at one input. The serial DAC 11 and voltage comparator 12 are amenable to utilization of integrated circuit techniques for fabrication as a single unit 13, and particularly to utilization of metal-insulator-semiconductor integrated circuit fabrication techniques. The serial DAC circuit 11 of FIG. 1 and the voltage comparator 12, together with the circuitry shown in FIG. 2, appropriate connections therebetween and appropriate output terminals, may be fabricated on a single integrated circuit chip.

Control means are shown in FIG. 2 including a decoder 14, a counter 16, a clock 17, and an input storage register 18. A storage shift register 19 is shown receiving the output from voltage comparator 12 and transferring digital data to input storage resister 18. As shown in FIG. 2, a digital number stored in shift register 19 is transferred to storage register 18. The least significant bit (LSB) is shifted to the output of storage register 18 to provide a signal for actuating switch SWR1 if the LSB is a 1, and to actuate switch SWG1 if the LSB is a 0.

As is also shown in FIG. 2, a start input to counter 16 allows clock 17 to produce trains of output pulses from counter 16 having timed intervals. The trains of output pulses are connected to the input of decoder 14. Decoder 14 provides a "shift right" signal to storage shift register 19 so that shift register 19 may receive a digital number sequentially from the most significant bit to the least significant bit. Decoder 14 also provides a "shift" signal to storage register 18 to present the digital number at the output thereof sequentially from the least significant bit to the most significant bit. Decoder 14 also provides signals at timed intervals to switch SWC and switch SWG2 in the serial DAC of FIG. 1. The reference voltage terminal $V_R$ is connected to the serial DAC 11.

Figures 3, 4, 5, 6:
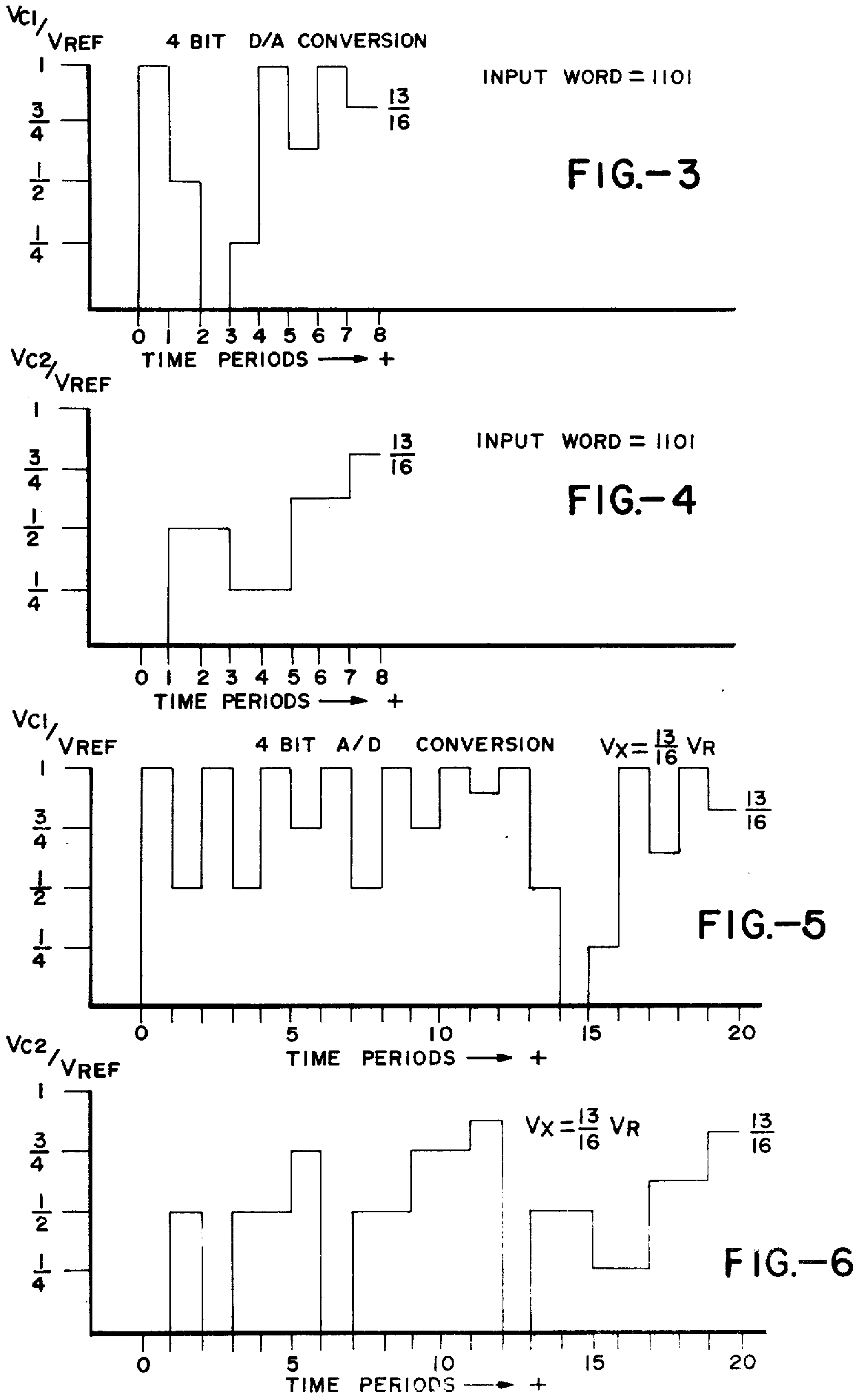
FIG. 3 is a timing diagram of the voltage on capacitor $C_1$ of FIG. 1 for a 4 bit digital to analog conversion.
FIG. 4 is a timing diagram of the voltage on capacitor $C_2$ of FIG. 1 for a 4 bit digital to analog conversion.
FIG. 5 is a timing diagram of the voltage on capacitor $C_1$ for a 4 bit analog to digital conversion.
FIG. 6 is a timing diagram of the voltage on capacitor $C_2$ of FIG. 1 for a 4 bit analog to digital conversion.

Referring to FIG. 3 a time diagram of the voltage on Capacitor C1 of FIG. 1 is shown where the time periods are the pulse durations provided by Clock 17. FIG. 3 shows a 4 bit digital to analog conversion wherein the digital number is 1101 which is equivalent to the binary fraction 13/16. The corresponding switch closures and voltages referenced to $V_R$ as they appear at $C_1$ and $C_2$ utilizing the circuit of FIG. 1 are shown in FIGS. 3 and 4 respectively. The switch closures by time period are shown in Table I below.

TABLE I

| TIME PERIOD | CLOSED SWITCHES | VC1/VR | VC2/VR |
|---|---|---|---|
| 0 | SWG1, SWG2 | 0 | 0 |
| 1 | SWR1 (1-LSB) | 1 | 0 |
| 2 | SWC | 1/2 | 1/2 |
| 3 | SWG1 (0-NLSB) | 0 | 1/2 |
| 4 | SWC | 1/4 | 1/4 |
| 5 | SWR1 (1-3LSB) | 1 | 1/4 |
| 6 | SWC | 5/8 | 5/8 |
| 7 | SWR1 (1-MSB) | 1 | 5/8 |
| 8 | SWC | 13/16 | 13/16 |

The mathematical representation of the manner in which the digital to analog conversion of FIGS. 3 and 4 takes place is shown in Table II below.

TABLE II

| TIME PERIOD | VC1 | VC2 |
|---|---|---|
| 0 | 0 | 0 |
| 1 | $b_0V_R$ | 0 |
| 2 | $\frac{b_0V_R}{2}$ | $\frac{b_0V_R}{2}$ |
| 3 | $b_1V_R$ | $\frac{b_0V_R}{2}$ |

TABLE II – Continued

| TIME PERIOD | VC1 | VC2 |
|---|---|---|
| 4 | $\frac{b1V_R}{2} + \frac{boV_R}{4}$ | $\frac{b1V_R}{2} + \frac{boV_R}{4}$ |
| 5 | $b2V_R$ | $\frac{b1V_R}{2} + \frac{boV_R}{4}$ |
| 6 | $\frac{b2V_R}{2} + \frac{b1V_R}{4} + \frac{boV_R}{8}$ | $\frac{b2V_R}{2} + \frac{b1V_R}{4} + \frac{boV_R}{8}$ |
| 7 | $b3V_R$ | $\frac{b2V_R}{2} + \frac{b1V_R}{4} + \frac{boV_R}{8}$ |
| 8 | $\frac{b3V_R}{2} + \frac{b2V_R}{4} + \frac{b1V_R}{8} + \frac{boV_R}{16}$ | $\frac{b3V_R}{2} + \frac{b2V_R}{4} + \frac{b1V_R}{8} + \frac{boV_R}{16}$ |

In general it is seen from the above that the following relation exists:

$$Vo = VC2 = \sum_{i=0}^{n-1} \frac{biV_R}{2^n} 2^i$$

For above: b3 = 1; b2 = 1; b1 = 0; bo = 1

$$V_O = VC2 = \frac{V_R}{2} + \frac{V_R}{4} + \frac{V_R}{16} = \frac{13V_R}{16}$$

It should be noted that for the circuit of FIG. 2 an n-bit digital to analog conversion takes 2n steps.

An example of a digital to analog conversion is shown below in Table III to further demonstrate the treatment of the least significant bit in the digital number to the most significant bit in performing the conversion utilizing the circuit of FIG. 1. The digital number 0111 corresponding to binary fraction 7/16 is converted.

TABLE III

| TIME PERIOD | CLOSED SWITCHES | $VC1/V_R$ | $VC2/V_R$ |
|---|---|---|---|
| 0 | SWG1, SWG2 | 0 | 0 |
| 1 | SWR1 (1-LSB) | 1 | 0 |
| 2 | SWC | 1/2 | 1/2 |
| 3 | SWR1 (1-NLSB) | 1 | 1/2 |
| 4 | SWC | 3/4 | 3/4 |
| 5 | SWR1 (1-3LSB) | 1 | 3/4 |
| 6 | SWC | 7/8 | 7/8 |
| 7 | SWG1 (0-MSB) | 0 | 7/8 |
| 8 | SWC | 7/16 | 7/16 |

The operation of the device disclosed herein will now be described as an analog to digital converter referring to FIGS. 5 and 6. A four bit analog to digital conversion for an unknown voltage $Vx/VR = 13/16 = 1101_2$ (subscript indicates number base) is shown. The circuit of FIG. 1 is utilized providing the switch closures at time intervals as shown in Table IV (a) to provide the voltage ratios on capacitors C1 and C2 as shown in FIGS. 5 and 6 respectively.

TABLE IV (a)

| TIME PERIOD | CLOSED SWITCHES | $VC1/V_R$ | $VC2/V_R$ | COMPARATOR |
|---|---|---|---|---|
| 0 | SWG1, SWG2 | 0 | 0 | |
| 1 | SWR1 | 1 | 0 | |
| 2 | SWC | 1/2 | 1/2 | 1 (Vx ≥ Vo) |
| 3 | SWR1, SWG2 | 1 | 0 | |
| 4 | SWC | 1/2 | 1/2 | |
| 5 | SWR1 | 1 | 1/2 | |
| 6 | SWC | 3/4 | 3/4 | 1 (Vx ≥ Vo) |
| 7 | SWR1, SWG2 | 1 | 0 | |
| 8 | SWC | 1/2 | 1/2 | |
| 9 | SWR1 | 1 | 1/2 | |
| 10 | SWC | 3/4 | 3/4 | |
| 11 | SWR1 | 1 | 3/4 | |
| 12 | SWC | 7/8 | 7/8 | 0 (Vx<Vo) |
| 13 | SWR1, SWG2 | 1 | 0 | |
| 14 | SWC | 1/2 | 1/2 | |
| 15 | SWG1 | 0 | 1/2 | |
| 16 | SWC | 1/4 | 1/4 | |
| 17 | SWR1 | 1 | 1/4 | |
| 18 | SWC | 5/8 | 5/8 | |
| 19 | SWR1 | 1 | 5/8 | |
| 20 | SWC | 13/16 | 13/16 | 1 (Vx ≥ Vo) |

Reference is made to Table V (a) below to demonstrate the function performed by the circuit of FIG. 1 and providing an analog to digital conversion for the relationship $V_X/V_R = 7/16 = 0111_2$.

TABLE V (a)

| TIME PERIOD | CLOSED SWITCHES | $VC1/V_R$ | $VC2/V_R$ | COMPARATOR |
|---|---|---|---|---|
| 0 | SWG1, SWG2 | 0 | 0 | |
| 1 | SWR1 | 1 | 0 | |
| 2 | SWC | 1/2 | 1/2 | 0 (Vx<Vo) |
| 3 | SWR1, SWG2 | 1 | 0 | |

TABLE V (a)-Continued

| TIME PERIOD | CLOSED SWITCHES | $VC1/V_R$ | $VC2/V_R$ | COM-PARATOR |
|---|---|---|---|---|
| 4 | SWC | 1/2 | 1/2 | |
| 5 | SWG1 | 0 | 1/2 | |
| 6 | SWC | 1/4 | 1/4 | 1 (Vx ≥ Vo) |
| 7 | SWR1, SWG2 | 1 | 0 | |
| 8 | SWC | 1/2 | 1/2 | |
| 9 | SWR1 | 1 | 1/2 | |
| 10 | SWC | 3/4 | 3/4 | |
| 11 | SWG1 | 0 | 3/4 | |
| 12 | SWC | 3/8 | 3/8 | 1 (Vx ≥ Vo) |
| 13 | SWR1, SWG2 | 1 | 0 | |
| 14 | SWC | 1/2 | 1/2 | |
| 15 | SWR1 | 1 | 1/2 | |
| 16 | SWC | 3/4 | 3/4 | |
| 17 | SWR1 | 1 | 3/4 | |
| 18 | SWC | 7/8 | 7/8 | |
| 19 | SWG | 0 | 7/8 | |
| 20 | SWC | 7/16 | 7/16 | 1 (Vx ≥ Vo) |

An alternative analog to digital conversion program may be implemented which reduces the conversion time by two time periods by eliminating the first two steps toward arriving at the NMSB (steps 3 and 4 in Tables IV and V (a)) in the preceding program. This is possible because the VC2/$V_R$ value for steps following step 2 must be one-half whether the NSMB is a 1 or a 0. The corresponding modified sequences for $Vx/V_R = 1101_2 = 13/16$ and $Vx/V_R = 0111_2 = 7/16$ are shown in Tables IV (b) and V (b).

TABLE IV (b)

| TIME PERIOD | CLOSED SWITCHES | $VC1/V_R$ | $VC2/V_R$ | COM-PARATOR |
|---|---|---|---|---|
| 0 | SWG1, SWG2 | 0 | 0 | |
| 1 | SWR1 | 1 | 0 | |
| 2 | SWC | 1/2 | 1/2 | 1 (Vx ≥ Vo) |
| 3 | SWR1 | 1 | 1/2 | |
| 4 | SWC | 3/4 | 3/4 | 1 (Vx ≥ Vo) |
| 5 | SWR1, SWG2 | 1 | 0 | |
| 6 | SWC | 1/2 | 1/2 | |
| 7 | SWR1 | 1 | 1/2 | |
| 8 | SWC | 3/4 | 3/4 | |
| 9 | SWR1 | 1 | 3/4 | |
| 10 | SWC | 7/8 | 7/8 | 0 (Vx $<$ Vo) |
| 11 | SWR1, SWG2 | 1 | 0 | |
| 12 | SWC | 1/2 | 1/2 | |
| 13 | SWG1 | 0 | 1/2 | |
| 14 | SWC | 1/4 | 1/4 | |
| 15 | SWR1 | 1 | 1/4 | |
| 16 | SWC | 5/8 | 5/8 | |
| 17 | SWR1 | 1 | 5/8 | |
| 18 | SWC | 13/16 | 13/16 | 1 (Vx ≥ Vo) |

TABLE V (b)

| TIME PERIOD | CLOSED SWITCHES | $VC1/V_R$ | $VC2/V_R$ | COM-PARATOR |
|---|---|---|---|---|
| 0 | SWG1, SWG2 | 0 | 0 | |
| 1 | SWR1 | 1 | 0 | |
| 2 | SWC | 1/2 | 1/2 | 0 (Vx $<$ Vo) |
| 3 | SWG1 | 0 | 1/2 | |
| 4 | SWC | 1/4 | 1/4 | 1 (Vx ≥ Vo) |
| 5 | SWR1, SWG2 | 1 | 0 | |
| 6 | SWC | 1/2 | 1/2 | |
| 7 | SWR1 | 1 | 1/2 | |
| 8 | SWC | 3/4 | 3/4 | |
| 9 | SWG1 | 0 | 3/4 | |
| 10 | SWC | 3/8 | 3/8 | 1 (Vx ≥ Vo) |
| 11 | SWR1, SWG2 | 1 | 0 | |
| 12 | SWC | 1/2 | 1/2 | |
| 13 | SWR1 | 1 | 1/2 | |

TABLE IV (b)-Continued

| TIME PERIOD | CLOSED SWITCHES | $VC1/V_R$ | $VC2/V_R$ | COM-PARATOR |
|---|---|---|---|---|
| 14 | SWC | 3/4 | 3/4 | |
| 15 | SWR1 | 1 | 3/4 | |
| 16 | SWC | 7/8 | 7/8 | |
| 17 | SWG1 | 0 | 7/8 | |
| 18 | SWC | 7/16 | 7/16 | 1 (Vx ≥ Vo) |

Figure 12:
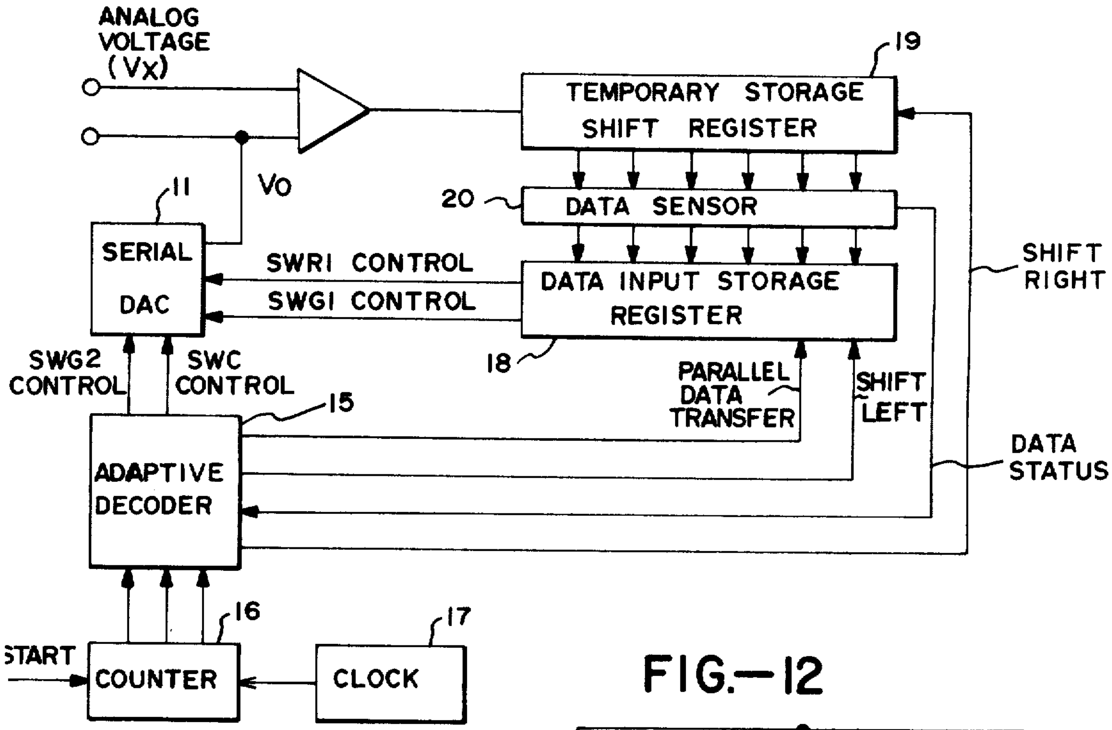
FIG. 12 is an adaptive reversible digital to analog converter.

A further alternative program involves the use of an adaptive decoder 15 and a data sensor 20 as shown in FIG. 12 to reduce the number of redundant charging steps in cases where consecutive bits in a digital number have the same value (i.e., either "1" or "0"). FIG. 12 may be seen to be the same as FIG. 2 except for the data sensor 20 for sensing consecutive bits of the same value and the adaptive decoder 15 for eliminating redundant charging steps. Typical sequences for the cases $Vx/V_R = 13/16$ and $Vx/V_R = 1/16$ are shown in Tables VI and VII respectively.

TABLE VI

| TIME PERIOD | CLOSED SWITCHEES | $VC1/V_R$ | $VC2/V_R$ | COM-PARATOR |
|---|---|---|---|---|
| 0 | SWG1, SWG2 | 0 | 0 | |
| 1 | SWR1 | 1 | 0 | |
| 2 | SWC | 1/2 | 1/2 | 1 (Vx ≥ Vo) |
| 3 | SWR1 | 1 | 1/2 | |
| 4 | SWC | 3/4 | 3/4 | 1 (Vx ≥ Vo) |
| 5 | SWR1 | 1 | 3/4 | |
| 6 | SWC | 7/8 | 7/8 | 0 (Vx $<$ Vo) |
| 7 | SWR1, SWG2 | 1 | 0 | |
| 8 | SWC | 1/2 | 1/2 | |
| 9 | SWG1 | 0 | 1/2 | |
| 10 | SWC | 1/4 | 1/4 | |
| 11 | SWR1 | 1 | 1/4 | |
| 12 | SWC | 5/8 | 5/8 | |
| 13 | SWR1 | 1 | 5/8 | |
| 14 | SWC | 13/16 | 13/16 | 1 (Vx ≥ Vo) |

TABLE VII

| TIME PERIOD | CLOSED SWITCHES | $VC1/V_R$ | $VC2/V_R$ | COM-PARATOR |
|---|---|---|---|---|
| 0 | SWG1, SWG2 | 0 | 0 | |
| 1 | SWR1 | 1 | 0 | |
| 2 | SWC | 1/2 | 1/2 | 0 (Vx $<$ Vo) |
| 3 | SWG1 | 0 | 1/2 | |
| 4 | SWC | 1/4 | 1/4 | 0 (Vx $<$ Vo) |
| 5 | SWG1 | 0 | 1/4 | |
| 6 | SWC | 1/8 | 1/8 | 0 (Vx $<$ Vo) |
| 7 | SWG1 | 0 | 1/8 | |
| 8 | SWC | 1/16 | 1/16 | 1 (Vx ≥ Vo) |

Figure 7:
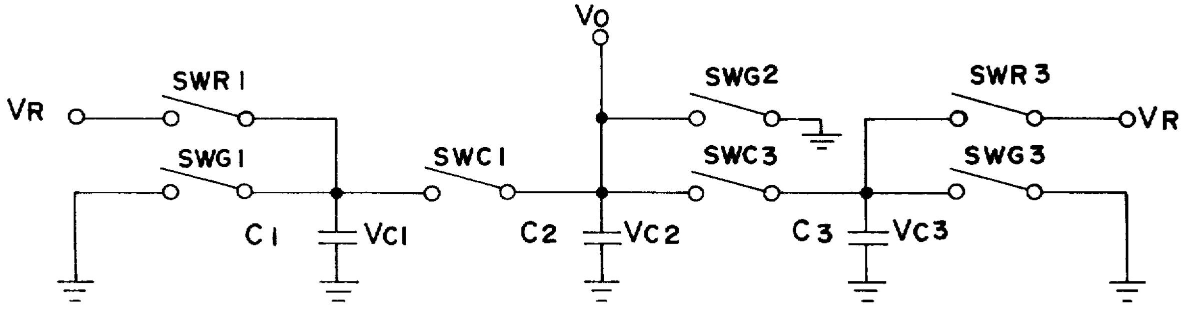
FIG. 7 is a schematic diagram for a serial ternary to analog conversion circuit.

By way of demonstrating that the basic principle may be expanded to provide conversion between digital and analog forms for any number base desired, reference is made to FIG. 7. As seen therein an additional capacitor C3 is provided with the capacitors C1 and C2. Switching means SWR3 and SWG3 are provided for charging and discharging capacitor C3 respectively. Switch SWC3 is provided to connect the ungrounded plates of capacitors C2 and C3. The manner in which a digital to analog conversion is made utilizing the circuit of FIG. 7 is best shown by reference to Table VIII where $Vo/V_R = 21_3 = 7/9 = 2/3 + 1/9$.

TABLE VIII

| TIME PERIOD | CLOSED SWITCHES | VC1 | VC2 | VC3 |
|---|---|---|---|---|
| 0 | SWG1 - 3 | 0 | 0 | 0 |
| 1 | SWR1 (1 - LSU*) | 1 | 0 | 0 |
| 2 | SWC1, 3 | 1/3 | 1/3 | 1/3 |
| 3 | SWR1, 3 (2 - NSLU) | 1 | 1/3 | 1 |
| 4 | SWC1, 3 | 7/9 | 7/9 | 7/9 |

* Least Significant Unit

As may be seen in Table VI 2*k* periods of time are required for a *k* ternary unit conversion.

To realize a ternary unit analog to digital conversion two different comparator reference levels, $V_H$ and $V_L$, are generated per step. This may be done either serially with four capacitors or in a parallel fashion with six capacitors. The digital to analog converter which may be used for a serial conversion is shown in FIG. 7 (a). Three capacitors C1, C2 and C3 are used to generate voltage level $V_H$, which is held in capacitor C2. Capacitors C1, C3 and C4 are then used to produce voltage level $V_L$, which is held in capacitor C4. Each digital to analog conversion sequence proceeds as in the binary case. To generate $V_H$ it is assumed that the value of the ternary unit is a "2". To Generate $V_L$ is is assumed that the ternary unit is a "1".

Table IX illustrates a serial base -3 conversion for the condition $Vx/V_R = 121_3 = 16/27$. In this instance as with the case in Table IV (b) the first two steps in the generation of $V_H$ and the first two steps in the generation of $V_L$ have been eliminated.

tation utilizing two binary voltage comparator means 22 and 23 for providing outputs of $V_{01}$ and $V_{02}$ respectively. The output from voltage comparator 22 will be some predetermined level when $V_X$ exceeds $V_H$ and will be 0 when $V_X$ is less than $V_H$. The output from both comparator 23 will be some predetermined level when $V_X$ exceeds $V_L$ and will be 0 when $V_X$ is less than $V_L$. In this fashion the 2, 1 and 0 output states are provided from comparators 22 and 23 when outputs $V_{01}$ and $V_{02}$ are both high, low and high, or both low respectively. The three states presented by comparators 22 and 23 may now be treated with standard logic to provide a binary output if desired.

Figure 10:
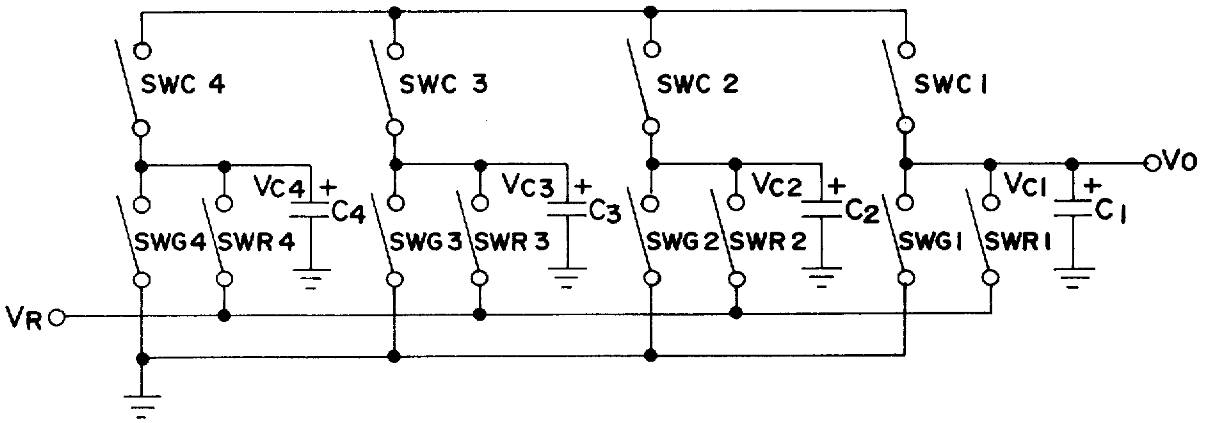
FIG. 10 is a schematic diagram for reducing conversion time required by the circuit of FIG. 1.

The number of time intervals for a conversion between digital and analog forms may be reduced from the number of time intervals required by switching circuit 11 of FIG. 1. Reference is made to FIG. 10 wherein four capacitors C1–C4 are shown having one plate connected to a common ground terminal. Switches SWC1-4 are shown for connecting any two or more of the ungrounded plates of the capacitors C1-C4. It should be noted that any of said switch means SWG1-4 and SWR1-4 may be operated simultaneously. In this fashion charged or discharged capacitors may be made available for the next desired charge sharing step without the necessity of using a time interval for charging a capacitor, as is required in the circuit of FIG. 1. Thus charging steps or discharging steps, as may be required by actuation of either SWR1 or SWG1 of FIG. 1, may be omitted after the first digital to analog conversion

TABLE IX

| TIME PERIOD | CLOSED SWITCHES | $VC1/V_R$ | $VC2/V_R$ | $VC3/V_R$ | $VC4/V_R$ | COMPARATOR |
|---|---|---|---|---|---|---|
| 0 | SWG1 - 4 | 0 | 0 | 0 | 0 | |
| 1 | SWR1, SWR3 | 1 | 0 | 1 | 0 | |
| 2 | SWC1, 2, SWC2, 3 | 2/3 | 2/3($V_H$) | 2/3 | 0 | |
| 3 | SWR1, SWG3 | 1 | 2/3 | 0 | 0 | |
| 4 | SWC1, 4; SWC3, 4 | 1/3 | 2/3($V_H$) | 1/3 | 1/3 | 1($V_L \leq V_x < V_H$) |
| (Steps may be eliminated as per Table IV (b)) | | 1 | 0 | 1 | 0 | |
| | | 2/3 | 2/3 | 2/3 | 0 | |
| | | 1 | 2/3 | 0 | 0 | |
| | | 1/3 | 2/3 | 1/3 | 1/3 | |
| 5 | SWR1, SWG3 | 1 | 2/3 | 0 | 1/3 | |
| | | (MSU = 1) | | | | |
| 6 | SWC12, SWC23 | 5/9 | 5/9($V_H$) | 5/9 | 1/3 | |
| 7 | SWR1, SWG3 | 1 | 5/9 | 0 | 1/3 | |
| | | (MSU = 1) | | | | |
| 8 | SWC14, SWC34 | 4/9 | 5/9($V_H$) | 4/9 | 4/9 | 2($V_x > V_H$) |
| 9 | SWR1, SWG2, SWR3, SWG4 | 1 | 0 | 1 | 0 | |
| 10 | SWC12, SWC23 | 2/3 | 2/3 | 2/3 | 0 | |
| 11 | SWR1, SWR3 | 1 | 2/3 | 1 | 0 | |
| | | (NMSU = 2) | | | | |
| 12 | SWC12; SWC23 | 8/9 | 8/9 | 8/9 | 0 | |
| 13 | SWR1, SWG3 | 1 | 8/9 | 0 | 0 | |
| | | (MSU = 1) | | | | |
| 14 | SWC12, SWC23 | 17/27 | 17/27($V_H$) | 17/27 | 0 | |
| 15 | SWR1, SWG3 | 1 | 17/27 | 0 | 0 | |
| 16 | SWC14, SWC34 | 1/3 | 17/27 | 1/3 | 1/3 | |
| 17 | SWR1, SWR3 | 1 | 17/27 | 1 | 1/3 | |
| | | (NMSU = 2) | | | | |
| 18 | SWC14, SWC34 | 7/9 | 17/27 | 7/9 | 7/9 | |
| 19 | SWR1, SWG3 | 1 | 17/27 | 0 | 7/9 | |
| | | (MSU = 1) | | | | |
| 20 | SWC14; SWC34 | 16/27 | 17/27($V_H$) | 16/27 | 16/27 | 1($V_L \leq V_x < V_H$) |

Figure 8:
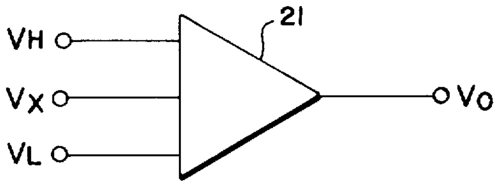
FIG. 8 is a dual comparator for use in converting an analog voltage to a ternary output.
Figure 9:
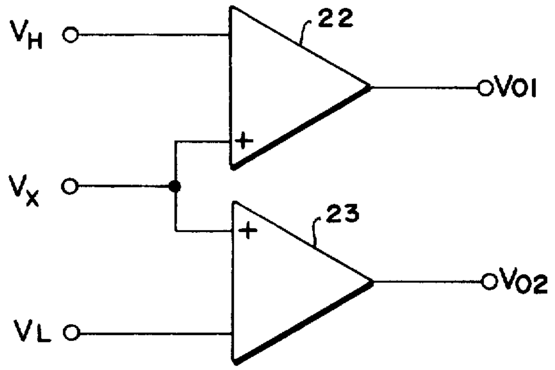
FIG. 9 is a practical comparator implementation for converting an analog voltage to representative ternary units.

FIG. 8 shows a schematic representation of a comparator 21 for receiving an analog voltage $V_X$ at one of the inputs thereto. Two other inputs, $V_H$ and $V_L$ are also introduced to comparator 21 so that an output $V_0$ may provide one of three states depending upon whether $V_X$ is greater than $V_H$, between $V_H$ and $V_L$, or below $V_L$. The circuit of FIG. 9 is a practical inplemensequence has occurred. This allows a marked decrease in time intervals required for converting an analog signal to a digital signal as shown in Table X below. It should be noted that the six steps required in Table X achieve the same result obtained through the twenty steps of Table V. Table X represents an analog to digital conversion for $Vx/V_R = 0111_2 = 7/16$

TABLE X

| TIME PERIOD | CLOSED SWITCHES | $VC1/V_R$ | $VC2/V_R$ | $VC3/V_R$ | $VC4/V_R$ | COMPARATOR |
|---|---|---|---|---|---|---|
| 0 | SWG1 - 4 | 0 | 0 | 0 | 0 | |
| 1 | SWR1, 3 | 1 | 0 | 1 | 0 | |
| 2 | SWC1, 2 | 1/2 | 1/2 | 1 | 0 | $0(V_x < V_o)$ |
| 3 | SWC1, 4; SWG2 | 1/4 | 0 | 1 | 1/4 | $1(V_x \geq V_o)$ |
| 4 | SWC2, 3 | 1/4 | 1/2 | 1/2 | 1/4 | |
| 5 | SWC1, 2 | 3/8 | 3/8 | 1/2 | 1/4 | $1(V_x \geq V_o)$ |
| 6 | SWC1, 3 | 7/16 | 3/8 | 7/16 | 1/4 | $1(V_x \geq V_o)$ |

Table XI below shows how the number of time intervals required for conversion from digital to analog form for the relationship $V_o/V_R = 0111_2 = 7/16$ is reduced using the circuit of FIG. 10.

TABLE XI

| TIME PERIOD | CLOSED SWITCHES | $VC1/V_R$ | $VC2/V_R$ | $VC3/V_R$ | $VC4/V_R$** |
|---|---|---|---|---|---|
| 0 | SWG1 - 4 | 0 | 0 | 0 | 0 |
| 1 | SWR2 (LSB) | 0 | [1]* | 0 | 0 |
| 2 | SWC1, 2; SWR3 (NLSB) | 1/2 | 1/2 | [1] | 0 |
| 3 | SWC1, 3; SWR2 (3LSB) | 3/4 | [1] | 3/4 | 0 |
| 4 | SWC1, 2; SWG3 (MSB) | 7/8 | 7/8 | [0] | 0 |
| 5 | SWC1, 3 | 7/16 | 7/8 | 7/16 | 0 |

* [ ] indicates loading of a bit
** C4 not used in D/A conversion in this example pacitor with the less significant bit. The remaining capacitor C1 holds the voltage level resulting from any previous conversion steps. Table XII shows the conversion sequence for $Vo/V_R = 0111_2 = 7/16$.

TABLE XII

| TIME PERIOD | CLOSED SWITCHES | $VC1/V_R$ | MSB $VC2/V_R$ | $VC3/V_R$ | LSB $VC4/V_R$ |
|---|---|---|---|---|---|
| 0 | SWG1 - 4 | 0 | 0 | 0 | 0 |
| 1 | SWR2 - 4 *LSB=1 **NLSB=1 | 0 | **1 | **1 | *1 |
| 2 | SWC1 - 4 | 3/4 | 3/4 | 3/4 | 3/4 |
| 3 | SWG2, 3 3LSB=1 SWR4 MSB =0 | 3/4 | 0 | 0 | 1 |
| 4 | SWC1 - 4 | 7/16 | 7/16 | 7/17 | 7/16 |

Figure 13:
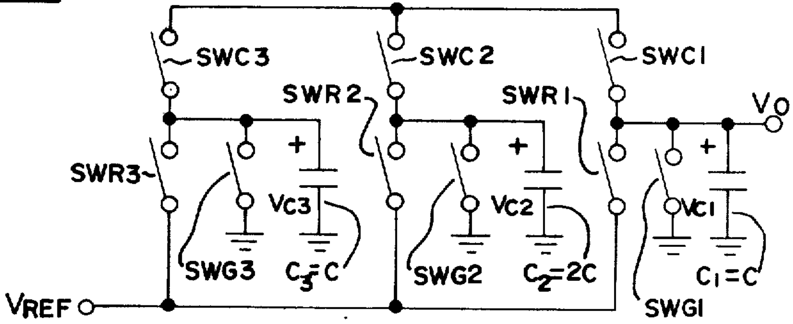
FIG. 13 is a digital to analog converter which utilizes binary weighted capacitors.
Figure 7A:
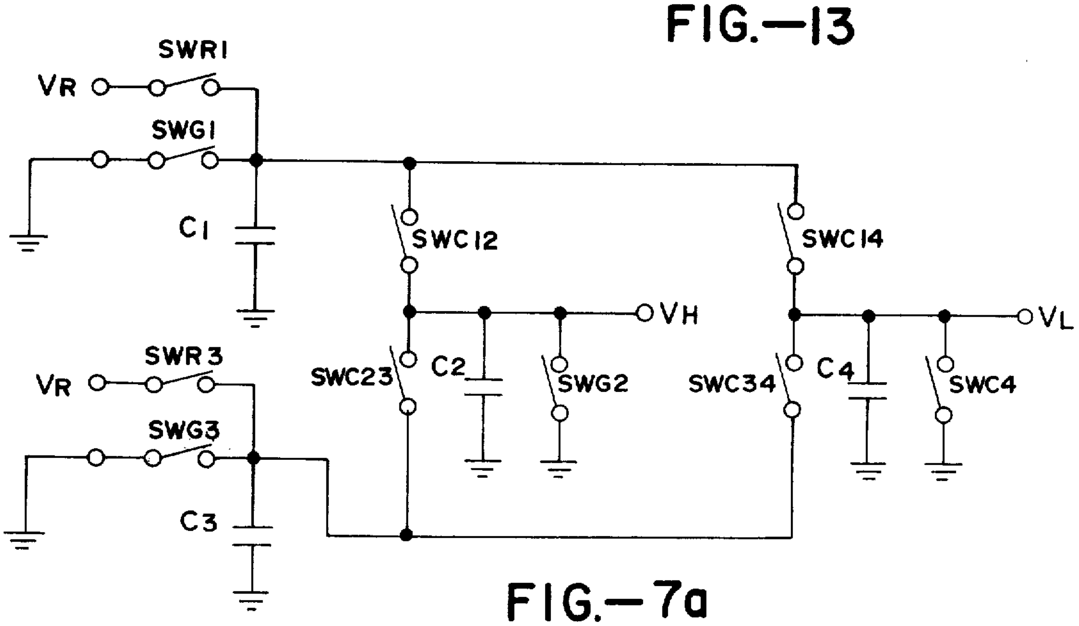
FIG. 7*a* is a schematic diagram for a practical serial ternary digital to analog conversion circuit.

Further reduction in conversion time is accomplished by considering several bits simultaneously. Reference is made again to the circuit in FIG. 10. Table XII below shows a digital to analog conversion wherein two bits are considered simultaneously. The sequence is realized by charging two capacitors in accordance with the more significant bit of the pair, and charging one capacitor with the less significant bit. The remaining capacitor C1 holds the voltage level resulting from any The preceding case is clearly equivalent to having a three capacitor circuit with $C_1 = C$, $C_2 = 2C$ and $C_3 = C$ as shown in FIG. 13. The principle illustrated in Table XII may be extended to cover any combination of capacitors scaled in size by factors of two. Table XIII lists the required capacitor combinations to realize an N-bit digital to analog conversion in a given number of steps.

TABLE XIII

| NUMBER OF CAPACITORS | $C_{N+1}$ | $C_N$ | $C_{N-1}$ ... $C_5$ $C_4$ $C_3$ $C_2$ | IME $C_1$ | CONVERTED PERIODS | BITS PER STEP |
|---|---|---|---|---|---|---|
| 2 | | | 1 | | 2N | 1 |
| 3 | | | 1 2 | 1 | 2N/2=N | 2 |
| 5 | | | 1 $2^3$ $2^2$ 2 | 1 | 2N/4=N/2 | 4 |
| N+1 | 1 | $2^{N-1}$ | $2^{N-2}$ ... $2^4$ $2^3$ $2^2$ 2 | 1 | 2N/N=2 | N |

Table XIV shows the analog to digital conversion sequence realized with the circuit of FIG. 13 for the condition $Vx/V_R = 0111_2 = 7/16$; $C_2 = 2C$ $C_1 = C$ $C_3 = C$. This serves to illustrate the conversion sequence when fewer capacitors are available than are specified as necessary for the conversion of Table XIII.

TABLE XIV

| TIME PERIOD | SWITCH CLOSURES | $VC2=/V_R$ | $VC3/V_R$ | $VC1/V_R$ | COMPARATOR | DAC INPUT |
|---|---|---|---|---|---|---|
| 0 | SWG1 - 3 | 0 | 0 | 0 | | |
| 1 | SWR2 | 1 | 0 | 0 | | 100 |
| 2 | SWC1 - 3 | 1/2 | 1/2 | 1/2 | 0 = MSB | |
| 3 | SWR3; SWG1, 2 | 0 | 1 | 0 | | 010 |
| 4 | SWC1 - 3 | 1/4 | 1/4 | 1/4 | 1 = NMSB | |
| 5 | SWR2,3; SWG1 | 1 | 1 | 0 | | 011 → 110 + 0-- |
| 6 | SWC1 - 3 | 3/4 | 3/4 | 3/4 | | |
| 7 | SWG2 | 0 | 3/4 | 3/4 | | |
| 8 | SWC1 - 3 | 3/8 | 3/8 | 3/8 | 1 = 3MSB | 0111 110 + 01- |
| 9 | SWR2,3; SWG1 | 1 | 1 | 0 | | |
| 10 | SWC1 - 3 | 3/4 | 3/4 | 3/4 | | |
| 11 | SWR2, SWG3 | 0 | 1 | 3/4 | | |
| 12 | SWC1 - 3 | 7/16 | 7/16 | 7/16 | 1 = LSB | |

In Table XIV, period 5, the input to the DAC should be 011. To accomplish this the input must be split to provide charges of 1,1, and 0 in period 5 on capacitors $C_2$, $C_3$ and $C_1$ respectively followed by charge sharing. Period 7 is such that charge is held on capacitors $C_3$ and C, and capacitor $C_2$ is discharged. In this fashion the 3MSB is obtained in two charging and sharing sequences. The least significant bit is obtained in a similar manner.

The preceding discussion may be summarized as follows:

In summary

1. A k-bit digital to analog conversion may be realized with the circuit in FIG. 1 in $2k$ steps (Tables I, II, III).
2.
   a. An M-bit analog to digital conversion may be realized with the circuit in FIG. 2 in M(M+1) steps (Tables IV (a) and V (a)).
   b. Conversion time may be reduced to (M−1) (M+2) steps by eliminating the 2 initial steps in the conversion (Tables IV (b) and I (b)).
   c. By the use of the adaptive decoder shown in FIG. 12 the conversion time may be further reduced in cases where consecutive bits have the same value (Tables VI and VII).
3.
   (a) For $k$ ternary units $2k$ time periods are required for a digital to analog conversion using the circuit in FIG. 7.
   b. Through the use of the circuit in FIG. 7 as the DAC and the circuit of FIG. 8 as the voltage comparator in the circuit of FIG. 2 a $k$-ternary-unit analog to digital conversion is realized in $2(k+2)(k-1)$ steps (Table IX).
4. By the use of additional capacitors the conversion time may be reduced. Specifically, for a three-capacitor circuit a $k$-bit digital to analog conversion takes $(k+1)$ steps (Table XI).
5. Additional reduction in conversion time is afforded by simultaneous consideration of more than one bit at a time in a binary weighted capacitor circuit such as the one shown in FIG. 13 (Tables XII through XIV).

The serial digital to analog converter (DAC) of FIG. 1 accomplishes a conversion by considering the least significant bit of the digital number first. In the fashion described above an analog voltage is provided at the ungrounded plate of capacitors C1 and C2 by the aforementioned switching sequence for each bit in the digital number, serially, from the least to the most significant. By addition of the voltage comparator 12 and control logic circuitry the serial DAC may be used to construct a successive approximation analog to digital converter as seen in FIG. 2. In converting from an analog to a digital signal the most significant bit of the digital number is treated first. For example, consider a point in the analog to digital conversion in which the $k$ most significant bits have been decided. To decide the $(k+1)$ bit, a $(k+1)$ bit digital to analog conversion is carried out in circuit 11 assuming the bit under consideration is a 1. If the bit under consideration should have been a zero, the digital to analog output voltage will exceed the encoded analog voltage and this will be indicated by the comparator 12 as a 0 output. In this fashion the correct value of the most significant bit of the digital number is stored and the next serial digital to analog conversion is started. Hence, the digital to analog conversion for the $k$ TH bit requires a $k$ redistributions, and, thus, the number of time intervals in the encoding sequence required for a digital number of M bits is M (M+1).

An apparatus and method for converting data between digital and analog forms has been described which is compatible with integrated circuit fabrication techniques, and in particular with metal-insulator-semiconductor integrated circuit fabrication techniques. Moreover, a circuit has been disclosed having greater potential accuracy than circuits realized heretofore. The improved accuracy results from the fact that converter circuits utilizing resistors have greater element value variation from the norm than converter circuits having matched capacitors. This is a direct result of the fact that with capacitors, as opposed to resistors, device shape can be optimized to minimize mismatches caused by uncertainties in geometry.

The present disclosure refers to a conversion technique and apparatus for M-bit analog to digital conversion requiring from M to M(M+1) time steps. In addition, the disclosed technique and apparatus realize an N-bit digital to analog conversion in from 2 to 2N time steps.

Figure 11:
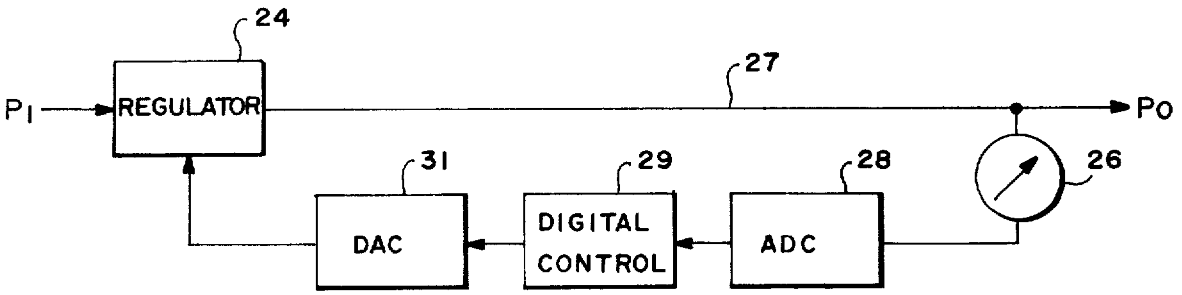
FIG. 11 is a practical implementation of the digital to analog and analog to digital functions of FIG. 2.

FIG. 11 shows one useful embodiment for the apparatus for converting data between digital and analog forms. As seen therein an input pressure P1 is delivered to a regulator 24 which provides a downstream regulated pressure $P_0$. A pressure sensor 26 is situated downstream from regulator 24 to sense the pressure in a downstream line 27. Pressure sensor 26 provides an output which is connected to analog to digital converter 28 which in turn provides a digital signal to digital control 29. Digital control 29 provides a digital number to the digital to analog converter 31 which provides an analog output signal connected to the regulator 24. The circuit disclosed herein may be used for both the analog to digital conversion and the digital to analog conversion. The circuit of FIG. 1 is especially adapted for monolithic integrated circuit construction and is also adapted for metal insulator semiconductor integrated circuit construction. The basic circuit of FIG. 1 requires only two precision matched capacitors, and associated switches which may be obtained through the fabrication methods mentioned above. An analog to digital converter has therefore been disclosed which is capable of providing heretofore unobtainable accuracy, using integrated circuit techniques, and specifically metal-insulator-semiconductor integrated circuit techniques, where there is no requirement for unity gain buffers, integrators, or other operational amplifier circuits.

I claim:

1. Apparatus for converting data between digital and analog forms, comprising a digital store for receiving a digital number;

a switch controlled capacitor charge circuit including a ground reference terminal and voltage reference terminal, first and second capacitors having substantially matched characteristics and each having one plate connected to said ground reference terminal, a charge sharing switch operative at times to connect the other plates of said first and second capacitors, first switch means operative at times to selectively connect the other plate of said first capacitor to said ground and voltage reference terminals, and second switch means operative at times to connect the other plate of said second capacitor to said ground reference terminal; and control means connected to said digital store for providing an initial closure of said second switch means thereby discharging said second capacitor followed by alternate operation of said charge sharing switch and said first switch means for each digital number bit, said alternate operation including closure of said first switch means to select said ground reference terminal for a least remaining significant bit zero and to select said voltage reference terminal for a least remaining significant bit one, and closure of said charge sharing switch, whereby an analog voltage corresponding to said digital number is produced at the other plate of said second capacitor when a reference voltage is applied to said voltage reference terminal.

2. Apparatus as in claim 1 wherein said digital store, switch controlled capacitor charge circuit, and control means are formed as a monolithic integrated circuit.

3. Apparatus as in claim 1 wherein said digital store, switch controlled capacitor charge circuit and control means are formed as a metal-insulator-semiconductor integrated circuit.

4. Apparatus as in claim 1 wherein said switch controlled capacitor charge circuit is a monolithic integrated circuit.

5. Apparatus as in claim 1 wherein said switch controlled capacitor charge circuit is a metal-insulator-semiconductor integrated circuit.

6. Apparatus as in claim 1 wherein said control means provides a control for said digital store, together with an unknown analog voltage input terminal, a voltage comparator having one input connected to said unknown analog voltage input terminal, another input connected to the other plate of said second capacitor and an output connected to said digital store, whereby analog voltages may be compared to provide said digital number bits for storage as controlled.

7. Apparatus as in claim 6 wherein said digital store, switch controlled capacitor charge circuit, control means, and comparator are formed as a monolithic integrated circuit.

8. Apparatus as in claim 6 together with a data sensor connected between the digital store and the control means, so that a bit having the same value as a preceding lesser significant bit may be sensed to eliminate redundant charging steps.

9. Apparatus as in claim 6 wherein said digital store, switch controlled capacitor charge circuit, control means, and comparator are formed as a metal-insulator-semiconductor integrated circuit.

10. Apparatus as in claim 6 wherein said voltage comparator is a monolithic integrated circuit.

11. Apparatus as in claim 6 wherein said voltage comparator is a metal-insulator-semiconductor integrated circuit.

12. Apparatus as in claim 6 wherein said digital store is a storage shift register, and wherein said control is a signal for shifting said register for receiving said digital number sequentially from the most to the least significant bit.

13. Apparatus as in claim 1 wherein said control means includes a clock, a counter connected to said clock for producing trains of timed output pulses, a decoder for receiving said trains of pulses and providing control signals for said charge sharing and second switch means, and a storage register for receiving said digital number from said digital store and providing control signals for said first switch means.

14. Apparatus as in claim 1 wherein said alternate operation requires a time interval for each operation together with at least one additional capacitor having one plate connected to said ground reference terminal, at least one additional switch means operative at times to selectively connect the other plate of said additional capacitor to said ground and voltage reference terminals, and at least first and second additional charge sharing switches operative at times to connect any predetermined two of the other plates of said first, second, and additional capacitors, said first and additional switch means capable of simultaneous operation, whereby operation of said first and additional switch means may be deleted subsequent to the first sequence thereby reducing the number of time intervals for converting data.

15. In combination with a digital store for receiving a digital number and control means connected to said digital store, a switch controlled capacitor charge sharing circuit, consisting of a ground reference terminal, a voltage reference terminal, first and second capacitors having substantially matched characteristics and having one plate connected to said ground reference terminal, first switch means operative at times to selectively connect the other plate of said first capacitor to said ground reference terminal and said voltage reference terminal, second switch means operative at times to connect the other plate of said second capacitor to said ground reference terminal, and a charge sharing switch operative at times to connect the other plates of said first and second capacitors, said control means operating to provide sequential operation for predetermined time intervals of said first and second switching means and said charge sharing switch, so that initially said second switch means is operated, followed by a number of alternate operations of said first switch means to select said ground reference terminal for a least remaining significant bit zero and to select said voltage reference terminal for a least remaining significant bit one, and closure of said charge sharing switch, said number of alternate operations and closures being equivalent to the number of bits in the digital number, whereby an analog voltage corresponding to said digital number is produced at the other plate of said capacitors when a reference voltage is applied to said voltage reference terminal.

16. Apparatus as in claim 15 wherein said switch controlled capacitor charge sharing circuit is a monolithic integrated circuit.

17. Apparatus as in claim 15 wherein said switch controlled capacitor charge sharing circuit is a metal-insulator-semiconductor integrated circuit.

18. In combination with a clock connected to a counter which when started provides trains of timed output pulses to a decoder which is connected to control first and second shift registers, wherein said first shift register receives a digital number at an input thereto successively from the most to the least significant bit, and wherein said second shift register receives said digital number from said first shift register and provides output therefrom successively corresponding to the bits from the least to the most significant bit, a circuit having a reference voltage connected thereto referred to a common electrical potential and operating to convert data between analog and digital forms, said circuit comprising, first and second capacitors having substantially identical capacitance values and having one plate each connected to common potential, a voltage comparator having first and second inputs and an output, a first switch connected between the reference voltage and the other plate of said first capacitor, a second switch connected between common potential and the other plate of said first capacitor, a third switch connected between the other plates of said first and second capacitors, a fourth switch connected between the other plate of said second capacitor and common potential, said other plate of said second capacitor being connected to said first input on said comparator, said output of said comparator being connected to said first shift register input, said second shift register output actuating said first switch closed when the least remaining significant bit is one and said second switch closed when the least remaining significant bit is zero, said decoder operating to actuate said fourth switch at the beginning of a digital to analog conversion and said third switch following actuation of said first and second switches, whereby when an analog voltage is placed on said second input of said voltage comparator a digital conversion is stored in said first shift register, and when a digital number is stored in said first shift register an analog voltage conversion appears at the other plate of said second capacitor.

19. The combination of claim 18 wherein said circuit is a monolithic integrated circuit.

20. The combination of claim 18 wherein said circuit is a metal-insulator-semiconductor integrated circuit.

21. A method for converting data between analog and digital forms comprising the steps of storing a digital number, timing trains of pulses, connecting one side of a first and second capacitor to a fixed electrical potential, controlling a switch circuit with the timed pulses and the least significant remaining bit in the digital number by serially, discharging the second capacitor with a timed pulse to the switch circuit, charging the first capacitor to the full scale value of the conversion voltage if the least significant remaining digital bit is a one, discharging the first capacitor if the least significant remaining digital bit is a zero, sharing the charges between the first and second capacitors with a timed pulse to the switch circuit, repeating the sequence of charging, discharging, and sharing of charge between the first and second capacitors for as many sequences as there are bits in the digital number, whereby an analog voltage corresponding to the digital number is produced on the second capacitor.

22. A method as in claim 21 together with the steps of comparing an unknown analog voltage with the analog voltage on the second capacitor, producing an output from the comparison which is a predetermined voltage level for unknown voltages greater than the second capacitor voltage and which is a zero level for unknown voltages less than the second capacitor voltage, whereby a digital number corresponding to the unknown analog voltage is produced serially from the most to the least significant bit.

* * * * *